(12) United States Patent
Wester

(10) Patent No.: US 6,383,894 B1
(45) Date of Patent: May 7, 2002

(54) METHOD OF FORMING SCRIBE LINE PLANARIZATION LAYER

(75) Inventor: Neil S. Wester, Tempe, AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/541,135

(22) Filed: Mar. 31, 2000

(51) Int. Cl.[7] .......................... H01L 21/46; H01L 21/78; H01L 21/301
(52) U.S. Cl. .................. 438/462; 438/68; 438/113; 438/114; 438/460; 438/70
(58) Field of Search .................... 438/68, 70, 113, 438/114, 460, 462

(56) References Cited

U.S. PATENT DOCUMENTS 5,654,202 A * 8/1997 Daly et al. ............... 438/70

* cited by examiner

Primary Examiner—Caridad Everhart
Assistant Examiner—Craig P. Lytle
(74) Attorney, Agent, or Firm—Blakely, Sokoloff, Taylor & Zafman LLP

(57) ABSTRACT

In one aspect, a method is disclosed. The method comprises introducing a plurality of integrated circuits on a substrate, each integrated circuit separated from another by a scribe line area and introducing a masking material over a portion of the scribe line area. Following the introduction of the masking material, the method further includes introducing a material comprising a colorant over a portion of each of the plurality of integrated circuits and singulating the plurality of integrated circuits.

5 Claims, 5 Drawing Sheets

METHOD OF FORMING SCRIBE LINE PLANARIZATION LAYER

BACKGROUND OF THE INVENTION

1. Field of the Invention

The invention relates to wafer processing and more particularly to introducing colorants on a wafer.

2. Description of Related Art

Integrated circuit chips use colorants for a variety of applications. One common application is the use of a chip as an image sensor to capture a color image in a digital imaging system. In one example, the image sensor is a semiconductor chip made up of a number of photosensitive circuits, each photosensitive circuit capable of absorbing light. In color applications, each photosensitive circuit generally absorbs light through a color filter that represents a particular wavelength of light in the visible spectrum corresponding to the image sensed. The color filter generally contains a colorant, such as a pigment or dye.

A CMOS- or CCD-based image sensor is typically formed as a chip or die of a wafer of a number of chips and dies with each chip or die separated from one another by a scribe line or scribe line area. Once formed, the wafer is singulated into individual chips or dies using conventional wafer dividing tools. The chips or dies are singulated, for example, by sawing the wafer through the scribe line area.

In color applications, color filter array (CFA) material is introduced over a photosensing region or area of the chip or die. CFA material is typically a photoimageable material. The material is typically spin-coated on a wafer, baked, and exposed to ultraviolet light through a mask to crosslink or polymerize the CFA material where desired. The remainder of the CFA material is then removed.

A typical photoimageable CFA material is a two-phase material of an acrylic resin and an organometallic pigment. For spin-coating operations, the CFA material is usually combined into a solution with a casting solvent/dispersing agent to keep the pigment in solution. The solution is generally thixotropic in the sense that it has a variable viscosity. The spinning process tends to change this viscosity. There is also generally a step height between a chip or die and the scribe line area, such as for example, a step height on the order of five microns ($\mu$m). During a spinning operation of CFA material onto a wafer, there is a tendency to form inconsistencies, such as striations or different color patterns (e.g., different color saturation), brought about by physical forces associated with spinning CFA material in the presence of a step height. These striations or different color patterns translate into a systemic noise in the system.

What is needed is a technique for reducing striations of colorants in wafer processing, particularly involving spin-on processes of material containing a colorant.

SUMMARY OF THE INVENTION

In one aspect, a method is disclosed. The method comprises introducing a plurality of integrated circuits on a substrate, each integrated circuit separated from another by a scribe line area and introducing a masking material over a portion of the scribe line area. Following the introduction of the masking material, the method further includes introducing a material comprising a colorant over a portion of each of the plurality of integrated circuits and singulating the plurality of integrated circuits.

DETAILED DESCRIPTION OF THE INVENTION

The invention relates to wafer processing and the introduction of a material comprising a colorant over a substrate of a plurality of devices. The invention seeks to minimize, in one aspect, the inconsistency of colorant distribution across an area, such as a sensor area of an integrated circuit chip. In one aspect, the invention relates to a method including introducing a plurality of integrated circuits on a substrate, each integrated circuit separated from another by a scribe line area and introducing a masking material over a portion of a scribe line area. A method also includes, after introducing the masking material, introducing a material comprising a colorant over a portion of each of the plurality of integrated circuits and singulating the plurality of integrated circuits.

The invention also describes an apparatus of a plurality of devices (e.g., dies or chips) separated by a scribe line area. A masking material overlies a portion of the scribe line area. In one aspect, the apparatus is an intermediate structure that may be overcoated with a material comprising a colorant by way of a spinning process. The presence of the masking material overlying a portion of the scribe line area minimizes a typical step height between the die or chip and the scribe line area allowing the material comprising the colorant to be introduced without negative physical forces that may impede the even distribution of the material, particularly the colorant over the individual devices.

The following detailed description describes an embodiment of the invention involving fabricating image sensors as discrete integrated circuit devices on a wafer such as a semiconductor wafer. As noted above, image sensors typically use a CFA material over a photosensing region or area in color applications. The CFA material typically includes a colorant such as a pigment or dye. It is to be appreciated, however, that various other applications involving introducing a material comprising a colorant are contemplated by this invention. For example, using a colorant in a photoimageable or other polymer material as an indicator of curing or polymerization. Accordingly, the invention is not to be limited to image sensor applications or the introduction of color filter material over a device.

Figure 1:
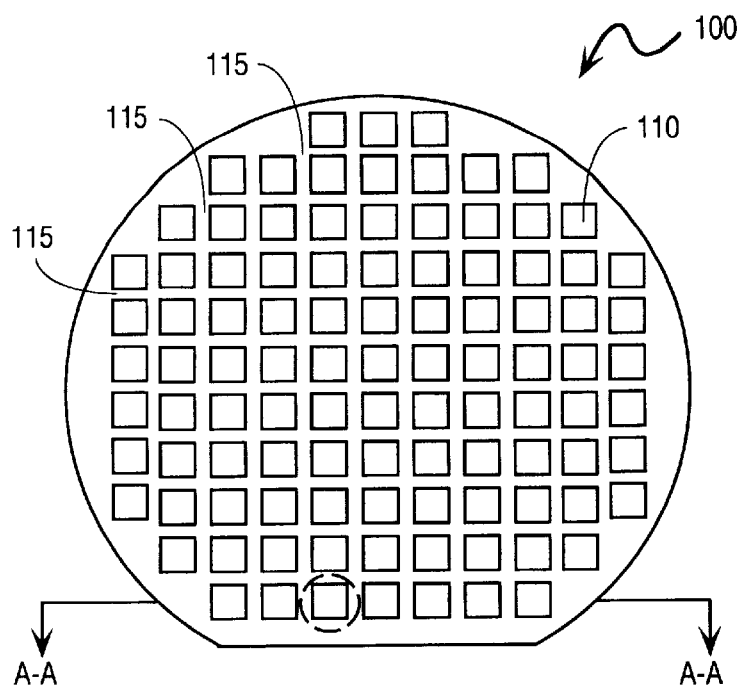
FIG. 1 shows a schematic top view of a wafer having a plurality of integrated circuit devices formed therein/thereon adjacent scribe line areas.

FIG. 1 shows a typical wafer comprising a plurality of devices (e.g., dies or chips) formed on and/or in the wafer. Wafer 100 is, for example, a semiconductor wafer such as a silicon wafer. Wafer 100 shows devices 110 separated from one another scribe line areas 115. Scribe line areas 115 provide a wafer area to singulate devices 110. Scribe line areas 115 may also contain test devices to facilitate testing of selected one of the plurality of devices 110.

Figure 2:
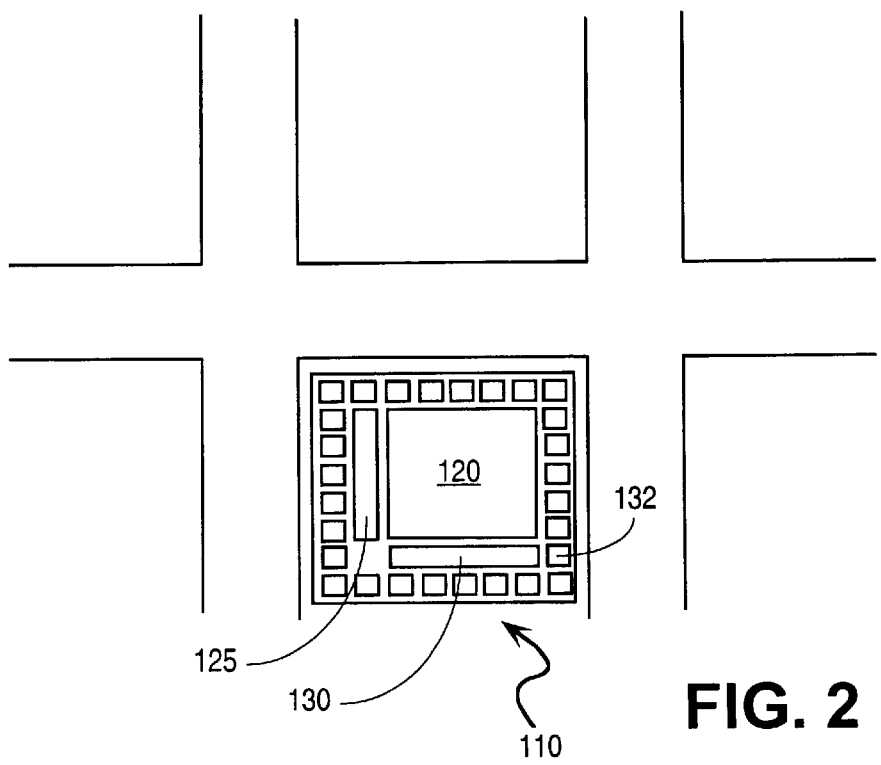
FIG. 2 shows a magnified top view of a portion of a wafer of FIG. 1 showing an integrated circuit device isolated by scribe line areas.

FIG. 2 shows a magnified view of device 110 on wafer 100. In this example, device 110 is an image sensor comprising photosensitive area 120 of a plurality of photosensitive circuits. The photosensitive circuits of an image sensor, often referred to as pixel circuits, are generally arranged in an array such as for example 480 rows by 640 columns. In general, each photosensitive circuit or pixel circuit contains a photosensitive element, such as a photodiode, and other circuitry. The photosensitive element defines photosensing region or area 120 of the photosensitive circuit that responds to light while the circuitry, generally speaking, drives a light signal from the photosensitive region or area to other process circuitry. Typically, device 110 includes column decoders 125 and shift registers 130 and is surrounded at its edges by bond pads 135 that electrically connect device 110 to the other components of the imaging system.

Figure 3:
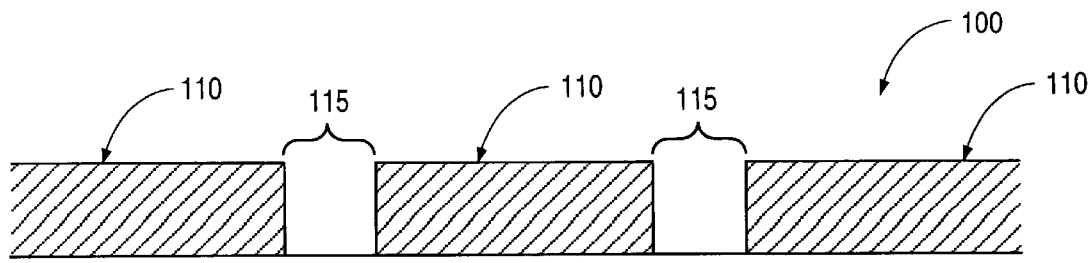
FIG. 3 shows a cross-sectional side view of a portion of the wafer of FIG. 1 through line A—A, showing a plurality of integrated circuit devices that are image sensors prior to the introduction of a colored filter material over each image sensor.

FIG. 3 shows a schematic, cross-sectional side view of a portion of wafer 100 taken through line A—A of FIG. 1. In particular, FIG. 3 shows three devices 110 separated from one another by scribe line areas 115. At this point, devices 110 are monochromatic in that no CFA material has been introduced over photosensing region or area 120 of the devices. In the following description, CFA material will be introduced to form image sensors for color applications.

Figure 4:
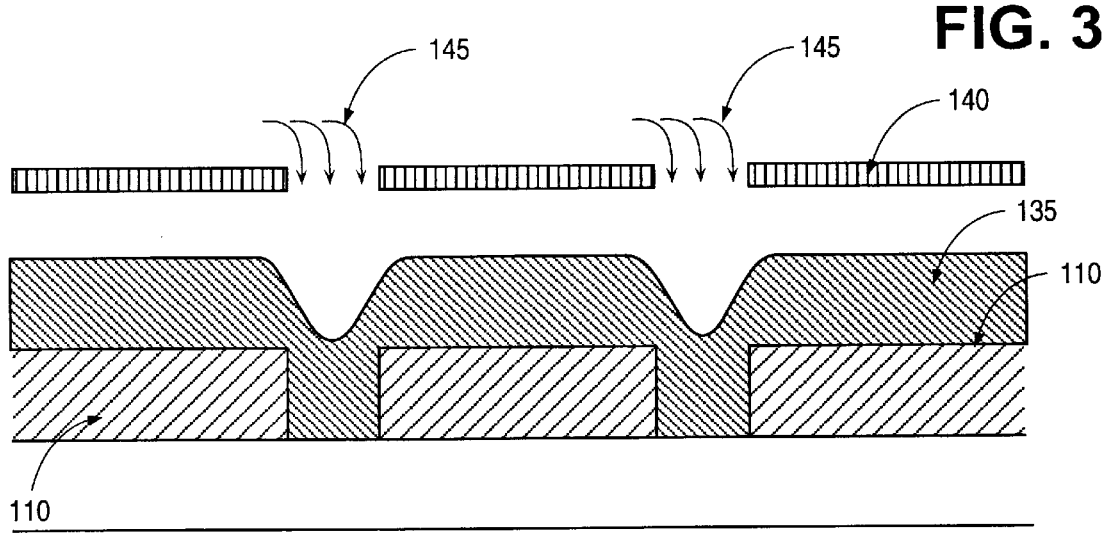
FIG. 4 shows the structure of FIG. 3 after the introduction of a masking material and shows the defining of the masking material in accordance with an embodiment of the invention.

FIG. 4 shows the structure of FIG. 1 after the introduction of masking material 135. In one embodiment, masking material 135 is conformally introduced by known introduction processes, including spin-coating. Masking material 135 is, in this embodiment, introduced to a step height corresponding to the thickness of devices 110. It is to be appreciated that a different introduction thickness may be used without departing from the invention. For example, an introduction to a thickness smaller than the step height of image sensors 110 may be suitable.

In one embodiment, masking material 135 is a photoimageable material. Masking material 135 is also, in one embodiment, a transparent material. Suitable photoimageable material that is also transparent includes certain materials having an acrylate moiety including an acrylate polymer of TMR-P7, commercially available from Tokyo Ohka Kogyo (TOK) Company of Japan.

Following introduction, masking material 135 is subjected to a photo-definition process. In the example shown in FIG. 4, masking layer 135 is introduced over the structure to define opening over scribe line areas 115. The structure is then exposed to light source 145, such as an ultraviolet or other light source. The light source transforms a portion of masking material 135, the exposed portion, and ignores the non-exposed portion of masking material 135.

Figure 5:
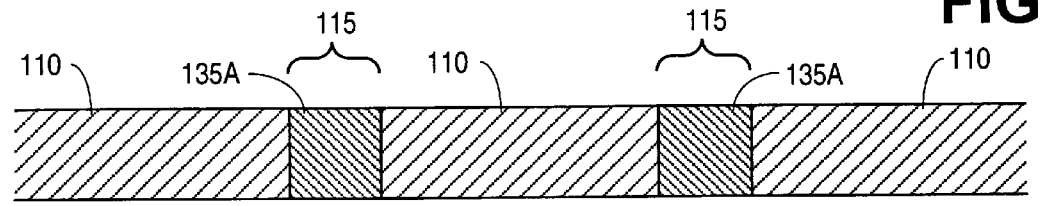
FIG. 5 shows the structure of FIG. 4 after the definition of the masking material and the scribe line areas of the structure.

FIG. 5 shows the structure of FIG. 4 after the removal of masking material 135A in the non-exposed area. Suitable removal techniques include rinsing.

Following the photo-definition operation, the structure shown in FIG. 5 is cured, for example, by thermal curing operation. In the example of a TMR-P7 acrylate polymer, one thermal curing operation is subjecting the structure to a temperature of 400° C. for a sufficient period of time to cure the polymer.

Figure 6:
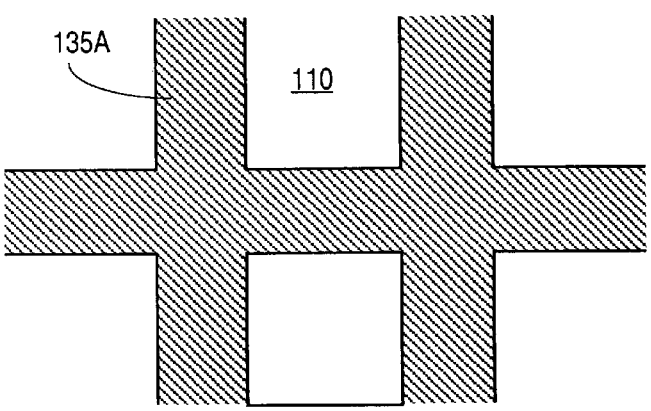
FIG. 6 shows a top view of the structure of FIG. 5.

As shown in FIG. 5, what remains after the photodefinition and subsequent processing is masking material 135A with completely filled scribe line areas 115 to a step height equivalent, in this example, to the step height of devices 110. It is to be appreciated that masking material 135A need not encompass the entirety of scribe line areas 115 but may instead occupy only a portion (e.g., a portion of the width) of scribe line areas 115. Similarly, masking material 135A need not be introduced to a step height equivalent to the step height of devices 110. One objective in introducing masking material 135A into scribe line areas 115 is to reduce or minimize the physical forces associated with the introduction of a subsequent material over the structure. By introducing masking material 135A to a thickness similar to the step height of devices 110, such physical forces, such as momentum changes brought about by a spinning process and thickness variations of the structure may be reduced. FIG. 6 shows a planar top view of the structure of FIG. 5.

Figure 7:
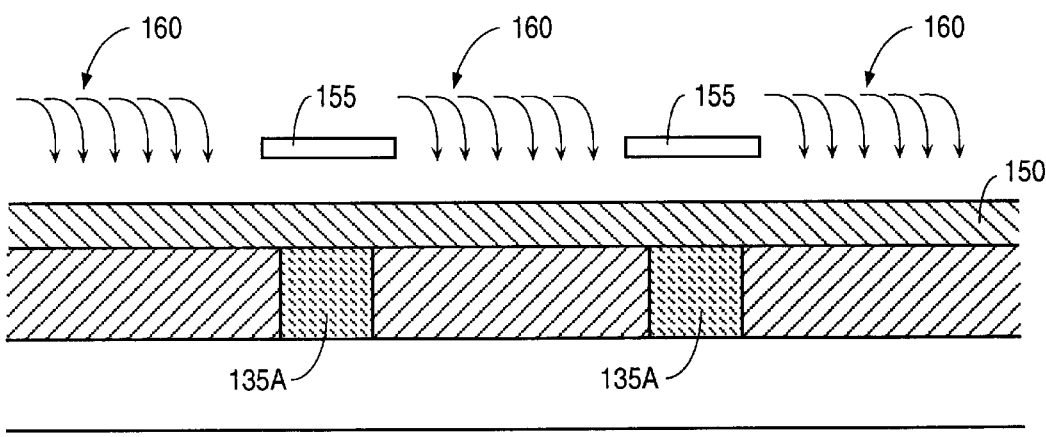
FIG. 7 shows the structure of FIG. 6 after the introduction of a colored filter material over the structure and defining the colored filter material.

FIG. 7 shows the structure of FIG. 5 following the introduction of a material comprising a colorant over the structure. In FIG. 7, CFA material 150 comprising a colorant that is, in one embodiment, a pigment is introduced over the structure. In one embodiment, prior to introduction, CFA material 150 comprising a pigment is combined into a solution with a casting solvent/dispersing agent.

In the embodiment described, CFA material 150 is photoimageable. Accordingly, following the introduction of CFA material 150, CFA material 150 is subjected to a photo-processing operation to transform a portion of CFA material 150. FIG. 7 shows masking layer 155 introduced over the structure to define the areas for photo-definition. FIG. 7 also shows the structure being exposed to light source 160, such as an ultraviolet light source, to transform a portion of CFA material 150. The photo-definition operation is accomplished by conventional processing techniques.

Figure 8:
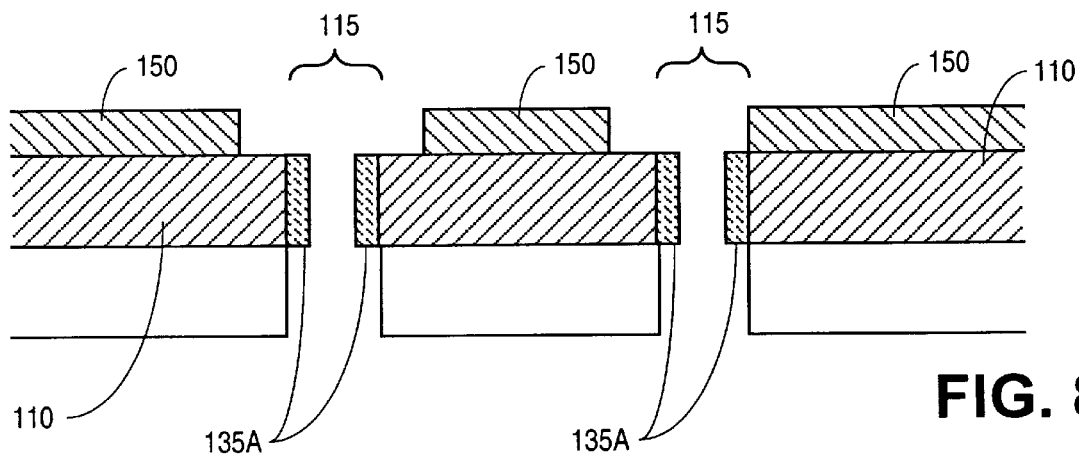
FIG. 8 shows the structure of FIG. 7 after the definition of the colored filter material and the singulation of devices.

FIG. 8 shows the structure of FIG. 7 after the transformation of a portion of CFA material 150 by photodefinition. After the transformation, CFA material 150 may be cured, such as by a thermal treatment. Following curing and possibly other processing operations, such as testing of un-singulated devices on wafer 100, the wafer is singulated, for example, by a conventional process. In one example, wafer 110 is singulated in scribe line areas 115 by a sawing process. In this example, the singulating process cuts through a portion of masking material 135A, leaving masking material 135A at the edges of the singulated devices. It is to be appreciated that, in the examples where masking material 135A does not occupy the entirety of scribe line areas 115, no masking material 135A may remain after the singulation operation.

Figure 9:
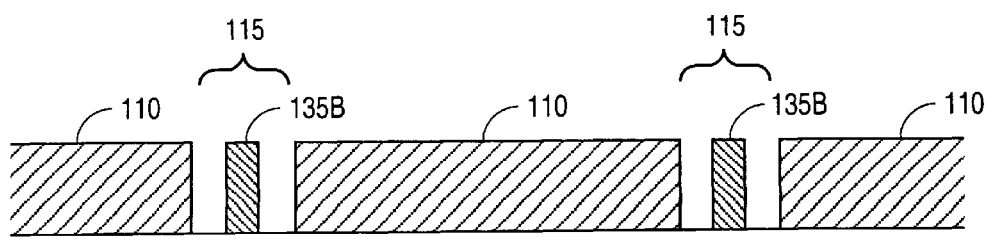
FIG. 9 shows a cross-sectional side view of a portion of a wafer having a plurality of integrated circuit devices formed therein/thereon adjacent scribe line areas and patterned masking material occupying an area less than the entire area of the scribe line areas in accordance with a second embodiment of the invention.
Figure 10:
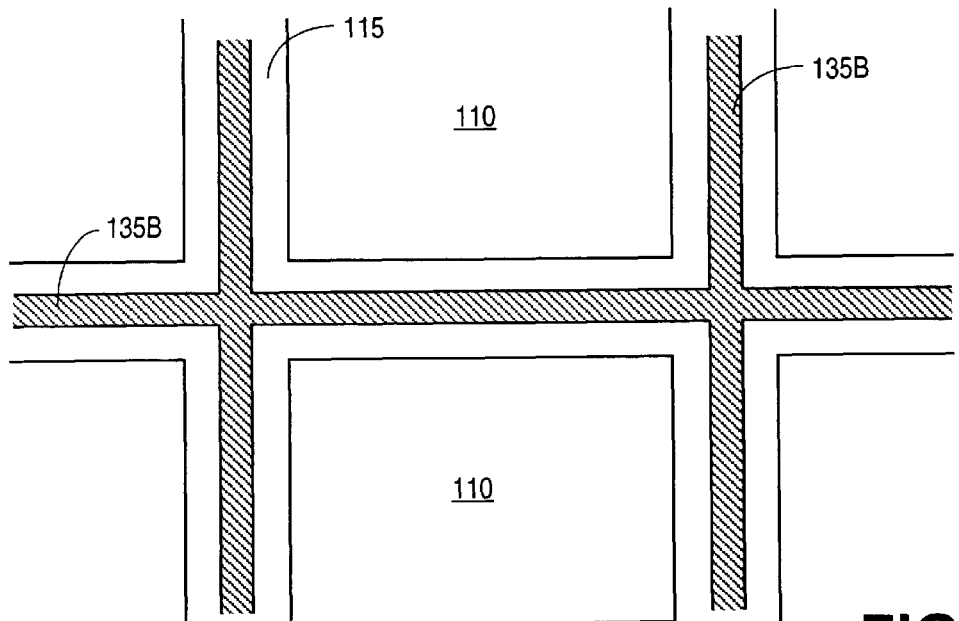
FIG. 10 shows a top view structure of FIG. 9.

As described above, scribe line areas 115 are filled with a transparent masking material (masking material 135A), in one embodiment, a transparent material. It is to be appreciated that the masking material need not cover the entire portion of scribe line areas 115. Instead, the invention contemplates that the masking material may cover less than the entire portion of scribe line areas 115. FIGS. 9–12 shows various embodiments of masking material coverage. FIG. 9 is a cross-sectional side view of a wafer having a plurality of devices 110. FIG. 9 shows devices 110 as, for example, monochromatic image sensors, prior to the introduction of CFA material. FIG. 9 shows masking material 135B as lines extending through scribe line areas 115. FIG. 10 shows a planar top view of this configuration.

Figure 11:
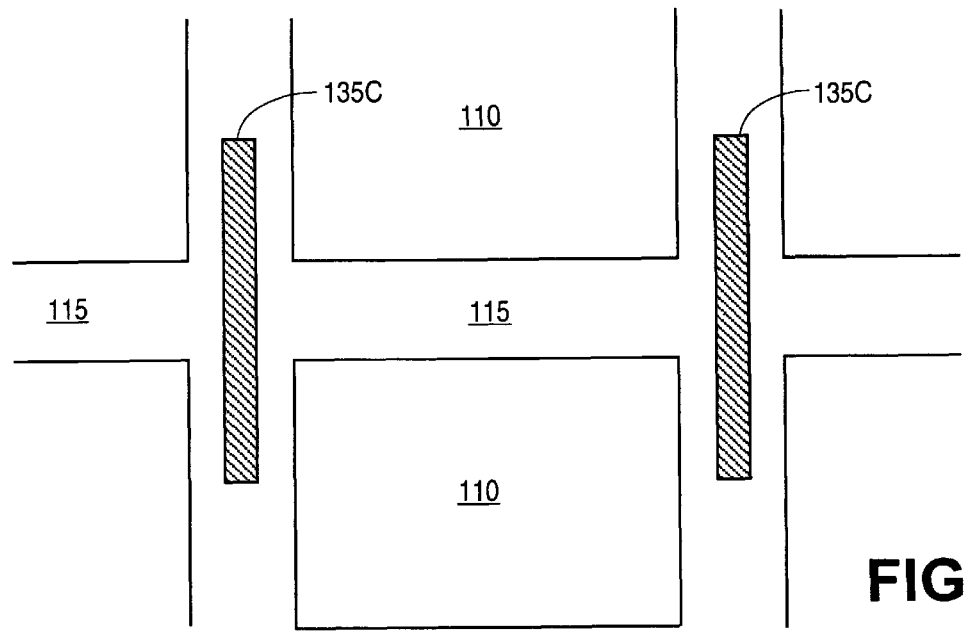
FIG. 11 shows a schematic top view of a portion of a wafer having a plurality of integrated circuit devices formed therein/thereon adjacent scribe line areas and pattern masking material formed in a portion of the scribe line areas according to a third embodiment of the invention.
Figure 12:
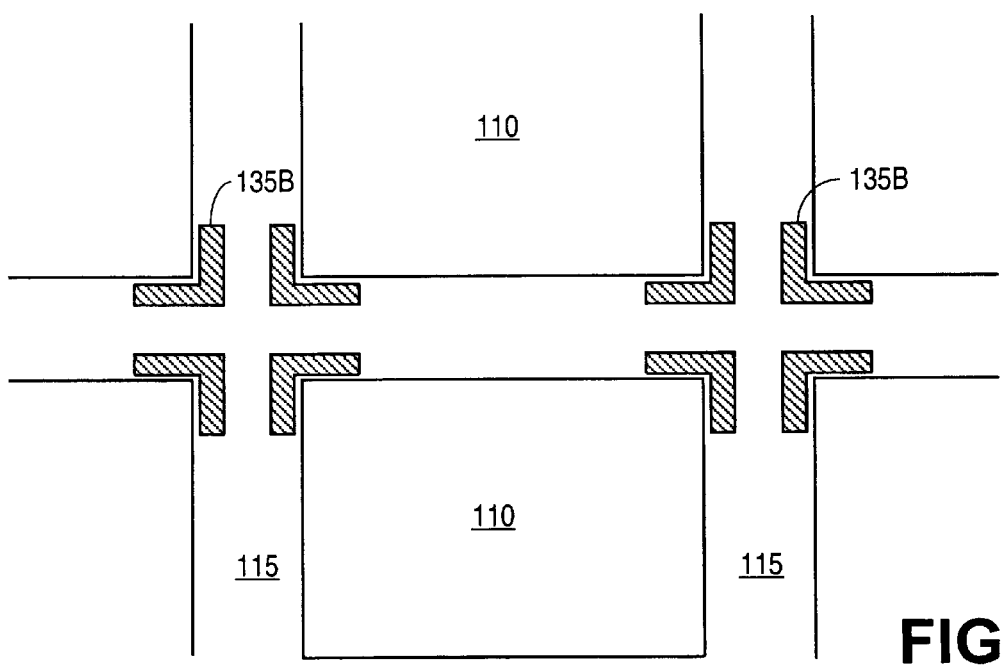
FIG. 12 shows a schematic top view of a portion of a wafer having a plurality of integrated circuit devices formed therein/thereon adjacent scribe line areas and pattern masking material formed in a portion of the scribe line areas according to a fourth embodiment of the invention.

FIGS. 11–12 show still further embodiments of masking material configurations and scribe line areas 115. In FIG. 11, masking material 135C is patterned as a plurality of discrete lines through scribe line areas 115. FIG. 12 shows masking material 135D patterned as chevrons at the edges of devices 110.

In the preceding detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. A method comprising:

introducing a plurality of integrated circuits on a substrate, each integrated circuit separated from another by a scribe line area;

introducing a masking material over a portion of the scribe line area and a portion of the plurality of integrated circuits;

removing the masking material from an area over the portion of the plurality of integrated circuits;

after removing the masking material, introducing a material comprising a colorant over a portion of each of the plurality of integrated circuits; and singulating the plurality of integrated circuits.

2. The method of claim 1, wherein introducing the masking material comprises introducing the masking material to a thickness similar to the thickness of an integrated circuit portion.

3. The method of claim 1, wherein the masking material comprises a photoimageable material, the method of introducing the masking material comprising photodefining the masking material.

4. The method of claim 1, wherein introducing the material comprising a colorant comprises a spinning process.

5. The method of claim 1, wherein the colorant comprises a pigment and each of the plurality of integrated circuits comprises a sensor portion, the introducing a material comprising a colorant comprising:

introducing a color filter material over a portion of the sensor portion.

* * * * *